(12) United States Patent  
Leshniak

(10) Patent No.: US 8,680,889 B2  
(45) Date of Patent: Mar. 25, 2014

(54) LIGHT EMITTING DIODE AND INTEGRATED PACKAGE THEREFOR

(76) Inventor: Itai Leshniak, Fair Lawn, NJ (US)

(*) Notice: Subject to any disclaimer, the term of this patent is extended or adjusted under 35 U.S.C. 154(b) by 121 days.

(21) Appl. No.: 13/372,783

(22) Filed: Feb. 14, 2012

(65) Prior Publication Data

US 2013/0207548 A1    Aug. 15, 2013

(51) Int. Cl.  
*H05B 37/00*     (2006.01)  
*H05B 41/00*     (2006.01)

(52) U.S. Cl.  
USPC ........ 326/121; 315/185 R; 315/186; 315/193; 315/291

(58) Field of Classification Search  
None  
See application file for complete search history.

(56) References Cited

U.S. PATENT DOCUMENTS

| | | | | |
|---|---|---|---|---|
| 8,084,780 | B2* | 12/2011 | Doan et al. | 257/100 |
| 8,299,724 | B2* | 10/2012 | Huynh | 315/291 |
| 8,324,840 | B2* | 12/2012 | Shteynberg et al. | 315/308 |
| 2009/0021955 | A1* | 1/2009 | Kuang et al. | 362/479 |

* cited by examiner

*Primary Examiner* — Anh Tran  
(74) *Attorney, Agent, or Firm* — Lightbulb IP, LLC

(57) ABSTRACT

An improved LED provides power efficient lighting while accepting a wide range of input voltages. The improved LED may comprise a controller that may measure a voltage, current, or other characteristics of input power and modify operation of the improved LED accordingly, such as to accept significantly more voltage or significantly less voltage while providing consistent light output. This allows light bulbs or other lighting to be easily manufactured with the improved LED. The improved LED may comprise the controller and one or more LED dies enclosed by a substrate and lens structure. Depending on the configuration of the controller, the improved LED may also provide time, temperature, and other measurement/response functions to help ensure consistent light output.

20 Claims, 11 Drawing Sheets

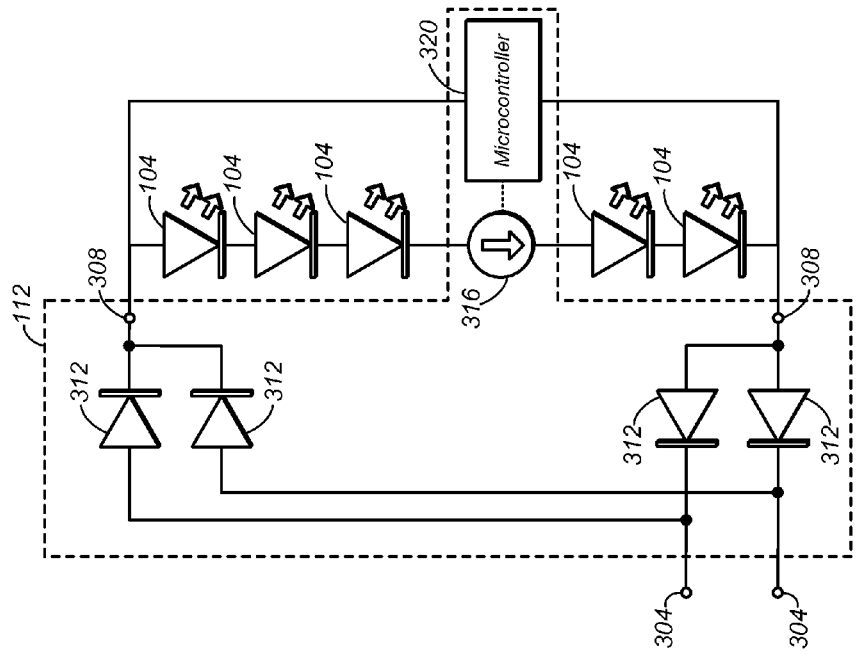
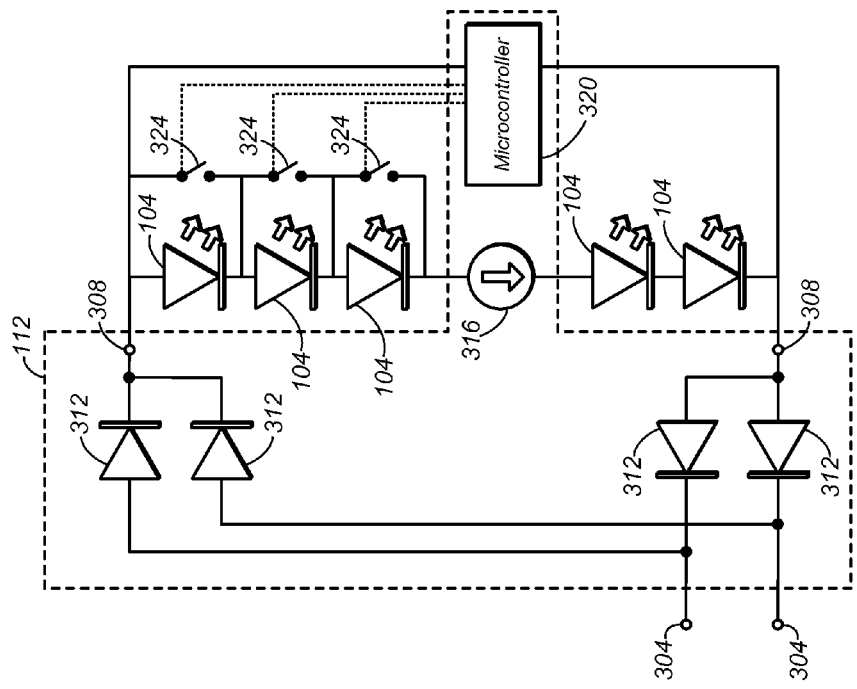

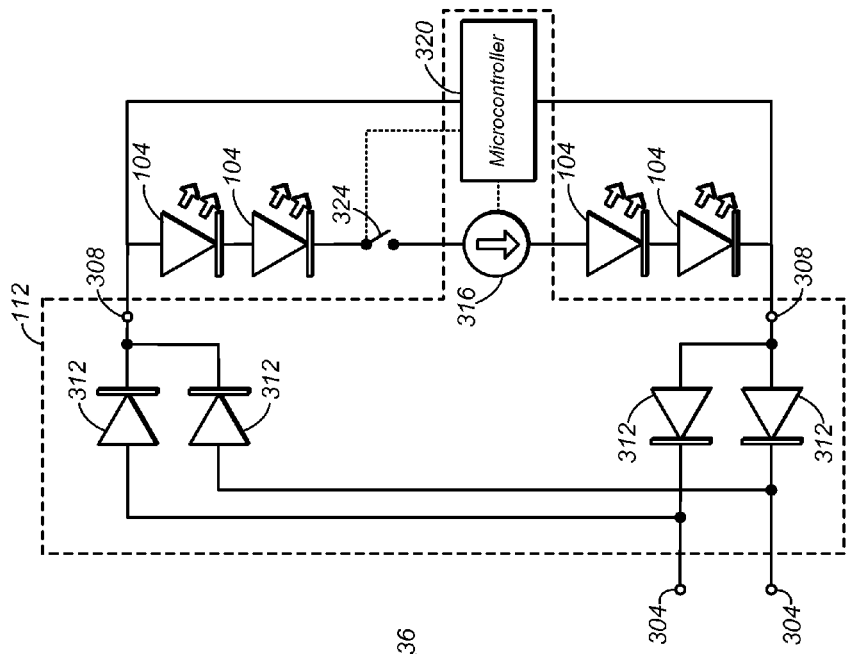
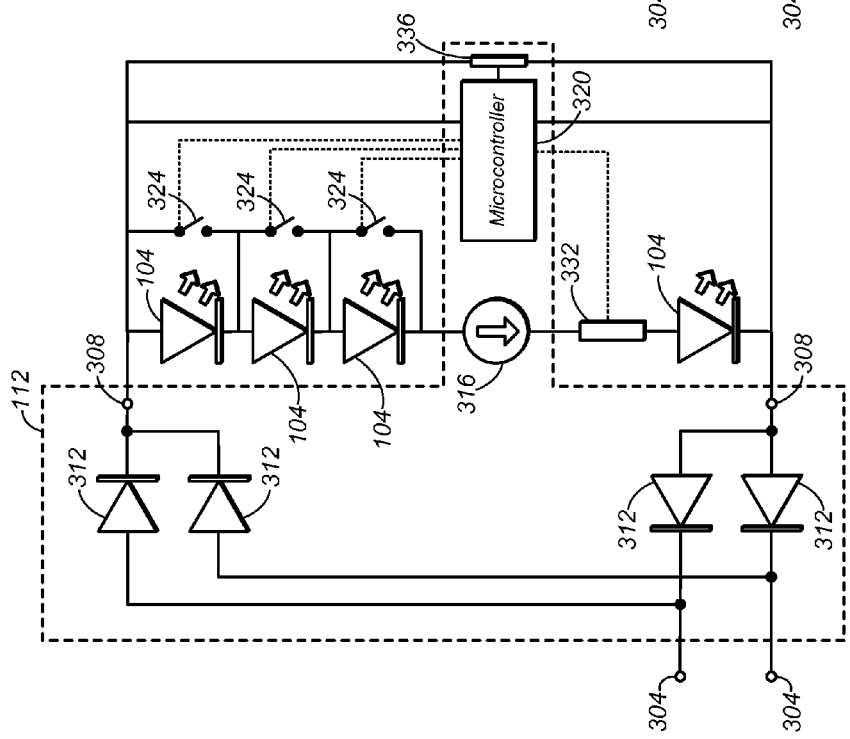

LIGHT EMITTING DIODE AND INTEGRATED PACKAGE THEREFOR

BACKGROUND OF THE INVENTION

1. Field of the Invention

The invention relates generally to light emitting diodes, and particularly to a self-contained power regulating light emitting diode.

2. Related Art

Light emitting diodes (LEDs) are greatly advantageous for lighting purposes. LEDs are rugged, have a long life, and are highly efficient light sources. Traditional lighting remains dominated by incandescent and fluorescent lighting technologies however. Though LED lighting is increasingly used, the unique DC power requirements of LED lighting has, at least in part, prevented their widespread manufacture and adoption for residential, commercial, and other use.

From the discussion that follows, it will become apparent that the present invention addresses the deficiencies associated with the prior art while providing numerous additional advantages and benefits not contemplated or possible with prior art constructions.

SUMMARY OF THE INVENTION

An improved LED is disclosed herein. In one or more embodiments, the improved LED automatically accepts a wide range of electrical input. For example, the improved LED may automatically accept AC or DC power of similar or significantly different voltages. The improved LED may detect or measure characteristics of the electrical input, such as its voltage, and in response adjust its internal operation to accept the electrical input. This allows the improved LED to be easily incorporated into light bulbs or other lighting for various uses. If the electrical input is beyond the capabilities of the improved LED, the improved LED may even shut itself off to prevent damage. In addition, the improved LED may provide features which help ensure consistent light output is provided even as the improved LED ages.

The improved LED may have various configurations. For example, in one embodiment, an improved LED may comprise a substrate having a planar shape, one or more LED dies mounted to the substrate, and a controller electrically coupled to the LED dies and mounted to the substrate. The controller may be configured to receive electrical input of varying voltage at one or more terminals, measure a current via the LED, and lower a current at at least one of the LED dies based on a comparison between the measured current and a predefined current value.

A lens may be mounted to the substrate and configured to cover the LED dies and the controller, so that the LED dies and the controller may be located between the lens and the substrate. The LED dies may be mounted around the controller to produce a light output that conceals the presence of the controller when the LED dies emit light. For example, the LED dies are mounted symmetrically around the controller. In addition or alternatively, the lens is translucent to diffuse light from the LED dies to conceal the presence of the controller.

The improved LED may also comprise at least one solid state switch coupled in parallel to at least one of the LED dies. The controller may then be further configured to measure a voltage of the electrical input, and compare the voltage to a predefined voltage value. The controller may open the switch to activate at least one of the LED dies coupled in parallel to the switch when the voltage is greater than the predefined voltage value, and close the switch to bypass at least one of the LED dies coupled in parallel to the switch when the voltage is less than the predefined voltage value.

Alternatively or in addition, a switch may be coupled in series to at least one of the LED dies. The controller may then be configured to close the switch to activate at least one of the LED dies coupled in parallel to the switch when the voltage is greater than the predefined voltage value, and open the switch to bypass at least one of the LED dies coupled in parallel to the switch when the voltage is less than the predefined voltage value.

It is contemplated that a switch may connect and disconnect the LED dies to the electrical input. In such case, the controller may be further configured to close the switch to connect the LED dies to the electrical input when the voltage is less than the predefined overvoltage value, and open the switch to disconnect the LED dies from the electrical input when the voltage is greater than the predefined overvoltage value.

It is noted that a timer configured to record the passage of time when activated may be provided. The controller may be configured to increase the predefined current value as the recorded time increases past one or more predefined thresholds. This allows increased current to be provided to the LED dies as their light output may diminish due to age. A thermal sensor may also be provided. The thermal sensor may be configured to measure the temperature of the LED dies. The controller may then be configured to lower a current of the electrical input at at least one of the LED dies based on a comparison between the measured current and a predefined current value In another exemplary embodiment, an improved LED may comprise a microcontroller configured to measure a voltage of an electrical input and compare the voltage to a predefined voltage value, and one or more first LED dies and one or more second LED dies. A circuit segment may connect the first LED dies. The circuit segment may have a total forward voltage comprising the sum of the forward voltage of the first one or more LED dies.

One or more switches may be coupled (in series or parallel) to the second LED dies. The switches may be configured to alter the total forward voltage of the circuit segment by connecting or disconnecting the second LED dies to the circuit segment. The switches may be controlled by the microcontroller.

An enclosure may be provided as well. The enclosure may comprise a substrate having the microcontroller, the first and second LED dies, the circuit segment, and the switches mounted thereto, and a lens above the substrate and covering at least the first and second LED dies.

The microcontroller may be configured in various ways. For example, the microcontroller may be further configured to measure a current by the electrical input and compare the current to a predefined current value, and alter the amount of the current provided to the circuit segment based on the comparison between the measured current and the predefined current value. Alternatively or in addition, the microcontroller may increase the total forward voltage of the circuit segment when the measured voltage is above or below the predefined voltage level depending on how the switches are coupled to the LED dies (e.g., in series or in parallel).

Various methods of providing LED light are also disclosed herein. For example, in one embodiment a method for providing LED light output with an improved LED comprises mounting one or more first LED dies to a substrate, mounting a microcontroller to the substrate, providing one or more electrical input terminals at the substrate.

A measuring device of the microcontroller may be connected to the input terminals and the first LED dies may be connected to the electrical input terminals with one or more electrical conductors. At least the first LED dies and the microcontroller may be covered with a lens.

In addition, one or more second LED dies and one or more switches may be mounted to the substrate. The second LED dies may be connected to the first LED dies through the switches. The microcontroller may operate (i.e., open or close) the one or more switches based on a comparison between a measured voltage from the measuring device and one or more predefined voltage thresholds. The one or more predefined voltage thresholds may be set by a user, manufacturer, install, or the like.

Since the improved LED is capable of accepting a range of input voltages the method may include providing electrical power of a first voltage to the electrical input terminals, and providing electrical power of a different second voltage to the electrical input terminals. The difference between the voltages may be substantial. For example, the first voltage may be between 100V and 120V while the second voltage may be between 230V and 250V. Also since the improved LED is capable of accepting various types of electrical input, the method may include providing AC power to the electrical input terminals, and providing DC power to the electrical input terminals.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 3C is a block diagram illustrating an exemplary improved LED having a modifiable forward voltage;

FIG. 3D is a block diagram illustrating an exemplary improved LED having adjustable current limiting capabilities

FIG. 3G is a block diagram illustrating an exemplary improved LED having a modifiable forward voltage and current limiting capabilities and optional bleeding transistor;

FIG. 3H is a block diagram illustrating an exemplary improved LED having overvoltage protection capabilities;

DETAILED DESCRIPTION OF THE PREFERRED EMBODIMENTS

In the following description, numerous specific details are set forth in order to provide a more thorough description of the present invention. It will be apparent, however, to one skilled in the art, that the present invention may be practiced without these specific details. In other instances, well-known features have not been described in detail so as not to obscure the invention.

The improved light emitting diode (LED) disclosed herein provides a number of benefits over traditional LEDs. As will be described further below, the improved LED allows manufacturers to easily construct LED-based lighting, such as LED bulbs and the like. In addition, with little or no research and development, manufacturers may build LED bulbs that compensate for power fluctuations (which are commonplace) and are dimmable, using the improved LED. These are both highly desirable characteristics for lighting and light bulbs. The improved LED may provide additional features and/or be provided in integrated packaging as well, which will be described further below.

Traditional LEDs consist of a diode having one or more electrical leads that allow the diode to be connected to a power source. The leads provide a direct connection to the LED. Because of this direct connection, the power applied to the leads must be carefully provided based on the specifications and characteristics of the particular traditional LED array at hand. As will be detailed herein, the improved LED is much more versatile and provides additional advantages including, the ability to operate on AC as well as DC power, automatic compensation for power fluctuations and, if desired, a built-in ability to dim.

Figure 1A:
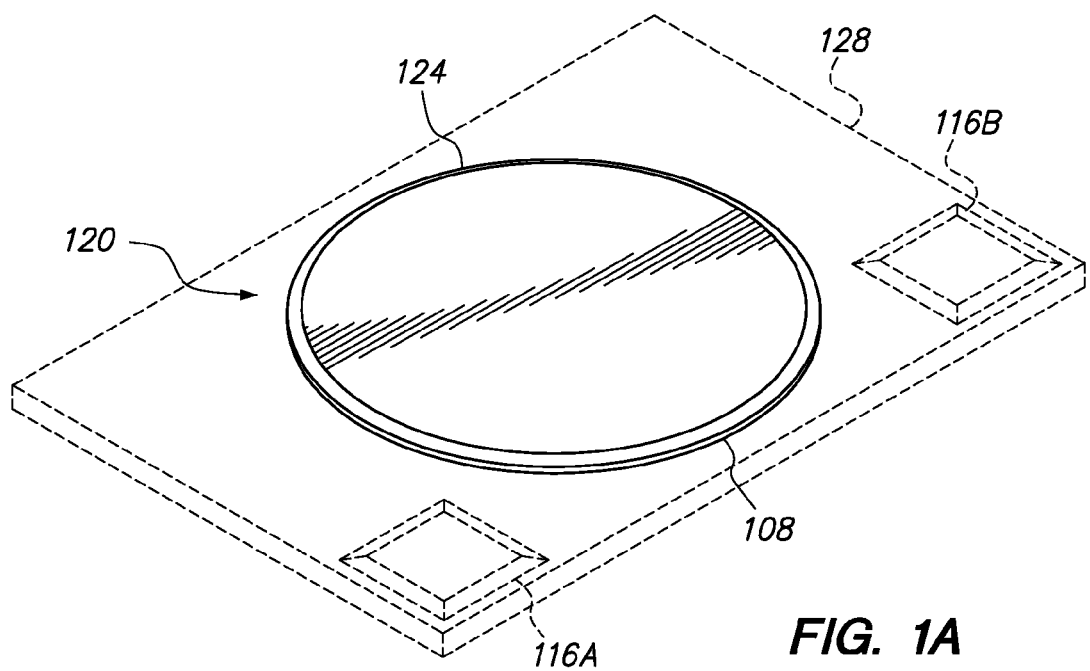
FIG. 1A is a perspective view of an exemplary improved LED.
Figure 1B:
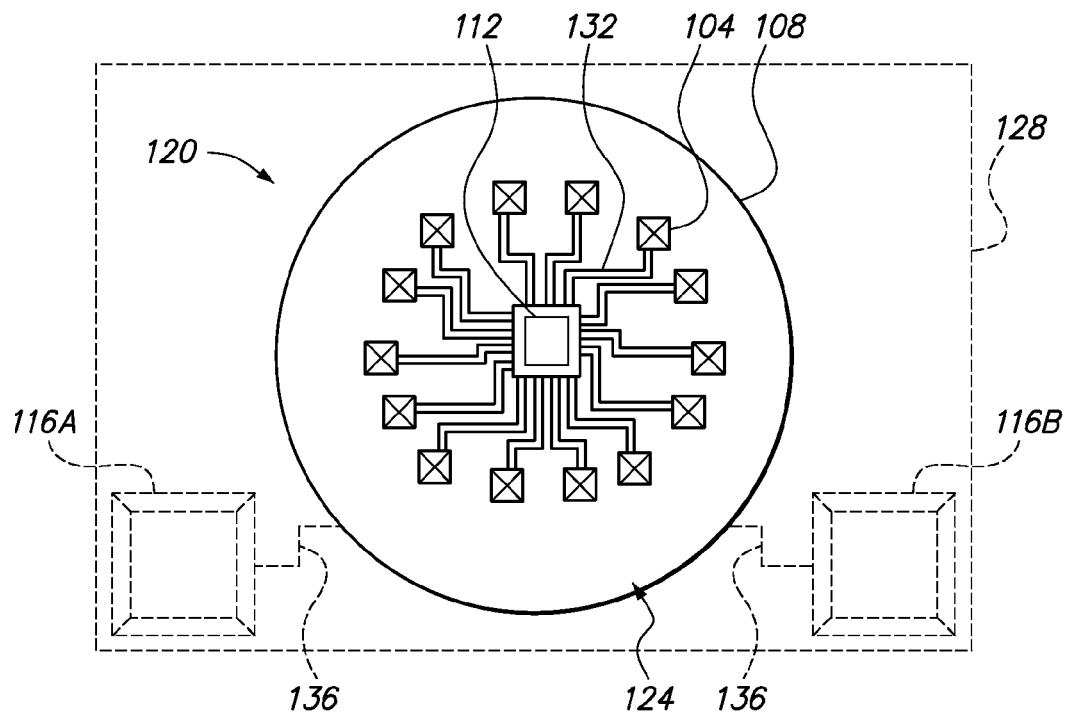
FIG. 1B is a top view of an exemplary improved LED.

The improved LED will now be described with regard to the figures. FIGS. 1A-1B illustrate an exemplary embodiment of the improved LED. As can be seen, the improved LED 120 may comprise one or more LED dies 104 and at least one controller 112 electrically coupled thereto. The LED dies 104 may be mounted on a substrate 108 which supports the LED dies. The controller 112 may also be mounted on the substrate 108. The improved LED may also comprise an optional lens 124 that may be placed over the LED dies 104. One or more electrical conductors 132, such as circuit traces or wires, may connect the LED dies 104 and the controller 112. The electrical conductors 132 may be supported, at least in part, by the substrate 108 in one or more embodiments.

As can be seen, the LED dies 104 may be mounted in a formation or arrangement on the substrate 108. In FIG. 1B for example, the LED dies 104 have been arranged in a circular formation with an open center or central area. This creates an open central area in which one or more controllers 112 may be mounted. Various other LED die 104 formations may be used. Typically, the LED die 104 formations will comprise a symmetrical shape with an open center or central area for the one or more controllers 112. For example, the LED dies 104 may be in an oval, square, or rectangular formation. In other embodiments, the LED dies 104 may be in a symmetrical polygonal formation, such as a star shape, triangle, pentagon, hexagon, or other polygonal shape.

A symmetrical formation of LED dies 104 is beneficial in that it causes the LED dies to distribute light evenly. In addition, the symmetrical formation provides a central area or space where one or more controllers 112 may be mounted. The light emitted from a symmetrical formation of LED dies 104 surrounds and thus masks the central area, thus hiding the presence of the controller 112 from an observer of the improved LED's light output.

LED die formations need not be perfectly symmetrical in all embodiments. For example, the position of individual LED dies 104 on either side of an improved LED 120 may differ slightly, such as to accommodate one or more controllers 112 or electrical conductors 132. The diffusion of the light emitted from the LED dies 104, such as by a lens 124, helps mask the non-perfect symmetry from observers of the light.

It is contemplated that one or more "rings" of LED dies 104 may be used in some embodiments. For example, referring to the embodiment of FIG. 1A, one or more concentric rings of LED die formations may surround the controller 112. In this manner, the number of LED dies 104 that may be used in the improved LED 120 may differ as desired. This may be used to control the power utilization and/or light output of the improved LED 120. Each ring of LED dies 104 may be densely or sparsely packed with a plurality of LED dies. The spacing between the LED dies 104 and controller 112 may vary as well. For example, in one embodiment, an LED die 104 or inner ring of LED dies may be adjacent (i.e. very close) to the controller 112. This allows an entire improved LED 120 to be confined within a miniscule space, sometimes substantially less than 1 cm in diameter.

A variety of substrates 108 may be used. In general, the substrate 108 comprises a rigid material that can hold the LED dies 104, controller 112, and electrical conductors 132 in place. The substrate material may be selected for its resistance to expansion, contraction, or both when subjected to temperature various, such as from heat generated by powering the improved LED 120. For example, the substrate 108 may comprise ceramic or metal in one or more embodiments. This resistance is beneficial in that it prevents the LED dies 104, controller 112, and electrical conductors 132 from damage caused by physical expansion or contraction.

In one or more embodiments, the substrate 108 may define the outer periphery of the improved LED 120. For example, in FIGS. 1A-1B 108 defines the peripheral shape of the improved LED 120. As shown, the lens 124 extends near or to the edge of the substrate 108. In this manner, the substrate 108 supports the lens 124 as well as the other components of the improved LED 120.

The substrate 108 may have various shapes, in addition to the shape illustrated in FIGS. 1A-1B. For example, the substrate 108 may have an oval, rectangular, square, or polygonal peripheral shape. In addition or alternatively, the peripheral shape of the substrate 108 may include one or more curves. The substrate 108 may also be a variety of sizes. In one embodiment, the substrate 108 may be sized to accommodate a desired number of controllers 112 and LED dies 104 while minimizing the surface area of the substrate. In such embodiments, the controller 112 and LED dies 104 may be more tightly arranged than other embodiments.

It is contemplated that the typically planar surface of the substrate 108 may also be curved in one or more embodiments. For example, the substrate 108 may be curved to conform to the shape of a curved or other shaped lens 124. In this manner, the LED dies 104 supported on the substrate 108 may be held an equal distance from the lens 124. This is highly beneficial in that the light emitted from the LED dies 104 passes through the same thickness of lens 124 due to the conforming shape of the substrate 108. In this manner, the improved LED 120 may provide the same color of light regardless of where an observer is positioned relative to the improved LED.

The substrate 108 may provide one or more electrical contacts or connection points to allow the improved LED 120 to be connected to other LEDs, power sources, or other electronic components. As shown in FIGS. 1A-1B for instance, the one or more electrical leads 136 may extend from electrical contacts or connection points of the improved LED 120. The electrical leads 136 may be extend to one or more terminals 116A,116B, such as those shown on the backer 128 of FIGS. 1A-1B. It is noted that the improved LED 120 may but need not be mounted to such a backer 128 during manufacturing. In addition, the substrate 108 may extend beyond the lens 124 or be otherwise configured to form the backer 128 in some embodiments. As can be seen, the terminals 116A,116B of the backer 128 provide an enlarged surface area to allow electrical connections to the improved LED 120 to be more easily made.

Though shown having a single improved LED 120 mounted thereto, it is contemplated that a plurality of improved LEDs may be mounted to a single backer 128. One or more electrical leads 132 may provide connections between and/or to the plurality of improved LEDs 120. For example, a plurality of improved LEDs 120 may be connected to one another or to the terminals 116A,116B, such as to share a power source or to share a connection with another electronic device.

In one or more embodiments, the improved LED 120 may include a lens 124 configured to alter the light emitted by the LED dies 104. For example, the lens 124 may alter the distribution of light (e.g., diffuse or focus the light) or the color of light from the LED dies 104. It is noted that in some embodiments, the lens 124 may be clear and, in such case, be used primarily to protect the LED dies 104 or focus the light if desired. Alternatively or in addition, the lens 124 may be impregnated or coated with various light altering substances, such as to change the color or diffuse light where desired. The lens 124 may also have a texture which diffuses light.

To generate white light, one or more blue LED dies 104 may be included in the improved LED 120. The blue light from such LED dies 104 may be altered by a lens 124 to produce white light. For example, a lens 124 having a phosphorous coating or phosphorous impregnated therein may be used to convert blue light from the LED dies 104 to white light by absorbing the blue light and lowering its energy to produce white light. It is contemplated that one or more or all of the LED dies 104 themselves may be coated with phosphorus in addition or instead of a phosphorus coated or impregnated lens 124.

It is contemplated that the lens 124 may include various types of phosphorous or other light-altering compounds such as to convert various colors of light from a first color to a second different color. In addition or alternatively, the lens 124 may be tinted one or more colors to change the color of the light emitted by the improved LED 120.

The lens 124 may have a variety of configurations. For instance, as shown, the lens 124 has a flat planar configuration that covers the LED dies 104 and controller 112. The lens 124 may cover then entire substrate 108 in some embodiments, such as by extending from one side of the substrate to another.

A lens 124 may be constructed in various ways and with various materials. For example, the lens 124 may comprise a rigid or flexible material. For example, the lens 124 may be a flat planar structure comprising silicon material having phosphorus embedded or mixed therein, such as shown in FIGS. 1A-1B. The lens 124 may then be placed and/or secured over one or more LED dies 104 and the controller 112. In this manner, the lens 124 protects the LED dies 104 and the controller 112 while altering the light emitted by the LED dies 104 to produce light with the desired color or other characteristics. It is contemplated that the lens 124 may be adhered or bonded to the substrate 108 to secure the lens 124 to the substrate 108 and/or LED dies 104 and controller 112. In some embodiments, the material used to construct the lens 124 may adhere itself to the substrate 108 and/or LED dies 104 and controller 112. Alternatively or in addition, one or more mechanical fasteners or structures may be used to secure the lens 124.

Figure 2A:
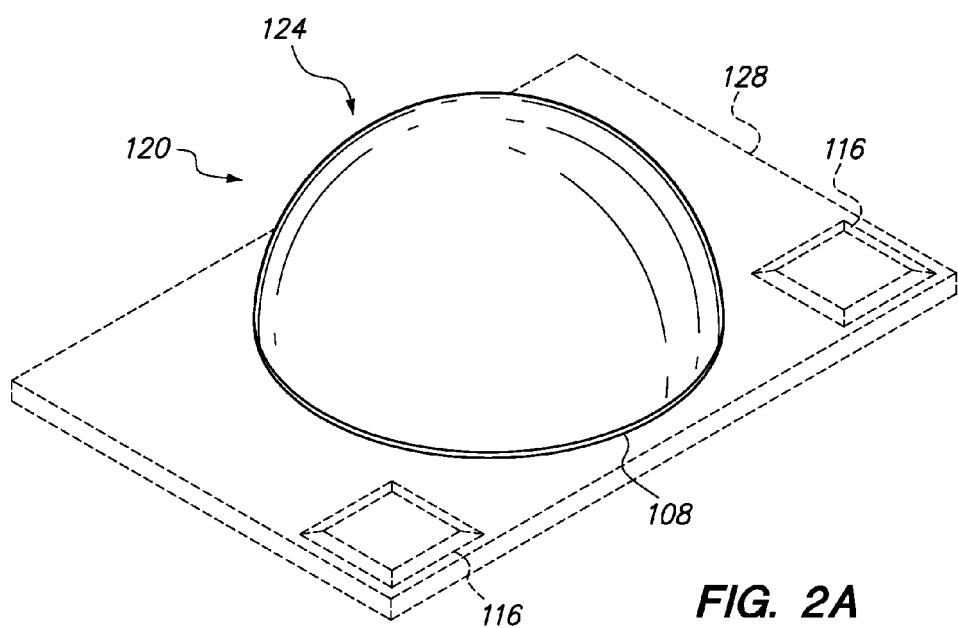
FIG. 2A is a perspective view of an exemplary improved LED.

FIG. 2A illustrates an improved LED 120 in a different configuration, namely, a convex lens 124 configuration. As can be seen, the lens 124 may curve outward from the substrate 108. The lens 124 shown may be a rigid structure, such as one made of silicone, glass, gemstone (e.g., sapphire), plastic, or other translucent or transparent material(s). It is contemplated that the lens 124 may be coated with phosphorus, or other light-altering compounds, and/or be impregnated with phosphorus or other light-altering compounds. Alternatively or in addition, the LED dies 104 themselves may be coated with such compounds, as discussed above.

The lens 124 may be configured as a shell that goes over the LED dies 104 and controller 112 in some embodiments. In other embodiments, the lens 124 may be a solid structure. For example, rather than being a convex shell the lens 124 could be a solid convex structure made of glass, silicone, or plastic with or without phosphorous deposited therein or coated thereon. It is contemplated that the LED dies 104 may themselves be coated with phosphorus or other light-altering compounds. In such embodiments, the lens 124 (solid or not) may be clear and/or lack phosphorus. Alternatively, the lens 124 may have its own phosphorus in addition to that of the LED dies 104. This provides multiple layers of phosphorus with the same or different characteristics, such as to provide light of a color or quality that is not easily achievable with a single layer or type of phosphorus.

As discussed above, the lens 124 may be secured to the improved LED 120 by adhesive, bonds, or mechanical structures or fasteners. In the embodiment of FIG. 2A, the lens 124 could be secured by a snap fit with one or more mounting protrusions or other structures of the substrate 108. Alternatively, the lens 124 may have a threaded bottom end which accepts a corresponding protrusion or thread of the substrate 108, or the substrate itself. In another embodiment, the lens 124 may be adhered or otherwise bonded to the substrate 108. In addition, it is contemplated that one or more pins, screw, clips, or other mechanical fasteners may be used to secure the lens 124. It is noted that the lens 124 may be removably secured in one or more embodiments, such as to allow an easy switch between various types of lenses 124. For example, a lens 124 without a phosphorus coating could be swapped with a lens having a phosphorus coating in one or more embodiments.

As can be seen from the preceding disclosure, the improved LED 120 comprises one or more LED dies 104 and at least one controller 112 covered by a single lens 124. The LED dies 104 and controller 112 are also typically on the same substrate 108 and share one or more electrical connection points to external electronic devices, such as other LEDs or power sources.

This encapsulation of one or more LED dies 104 and at least one controller 112 in an improved LED 120 by a lens 124 and substrate 108 of the improved LED is highly advantageous because it reduces the complexity of building and using LED lighting. In fact, in some embodiments, a user of the improved LED 120 may simply connect the improved LED to a power source (AC and/or DC), and the improved LED will work. This is because the controller 112 included in the integrated package provides a layer of abstraction, which allows the improved LED 120 to accept a wide variety of power sources while providing a number of other features (which will be described below).

This is in contrast to traditional LED which require a system of voltage regulators, drivers, and/or power supplies to provide the particular range of DC power required by the LED to operate as designed. This is because traditional LEDs require a forward voltage of 3 to 4 volts making them impossible to drive directly from an electrical outlet (such as a 110 volt or 220 volt power outlet). Traditional LEDs may be connected in series to accept the voltage of an electrical outlet. However, such a configuration does not compensate for voltage drifts (e.g., brownouts or surges) which are commonplace. In addition, such a configuration typically requires a significant number of LEDs to be connected together. For example, thirty 3 volt LEDs would need to be connected to accept a mere 90 volt power supply.

The improved LED 120 accepts a wide variety of power sources and may provide one or more additional features while being miniscule in size. As stated above, the overall diameter or size of an improved LED 120 may be measured in millimeters (i.e., be less than 1 cm) while including a controller 112 and the benefits thereof. Since an improved LED 120 may be built to such a miniscule size, improved LEDs of larger sizes may also be built, such as by increasing the size of the substrate 108, lens 124, the number or size of the LED dies 104, the number or size of the controllers 112, or various combinations thereof. Larger improved LEDs 120 may but need not be capable of handling increased power and of providing increased light output.

Figure 2B:
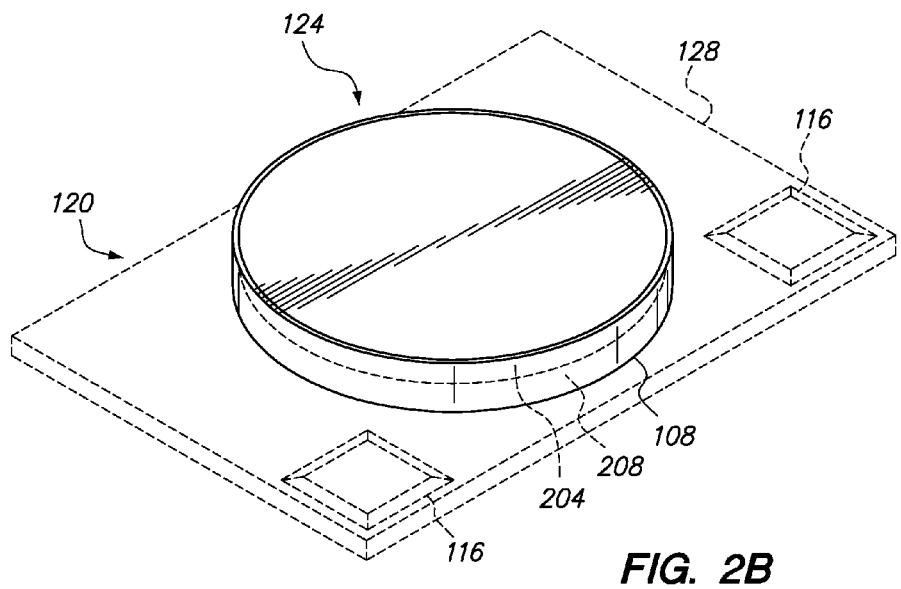
FIG. 2B is a perspective view of an exemplary improved LED.
Figure 2C:
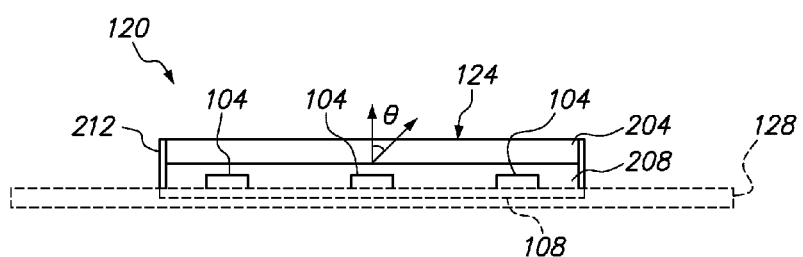
FIG. 2C is a side cross-sectional view of an exemplary improved LED.

FIGS. 2B-2C illustrate another exemplary embodiment of the improved LED 120. FIG. 2B shows a top perspective view while FIG. 2C shows a cross-sectional side view of the improved LED 120. As can be seen, the lens 124 may comprise a multi-layer structure in some embodiments. For instance, in FIGS. 2B-2C the lens 124 comprises a top layer 204 and a bottom layer 208.

In one embodiment, the layers 204,208 may each comprise a distinct material. For example, a first clear or substantially clear bottom layer 208 may be provided at the bottom of the lens 124. A second light-altering top layer 204 may then be deposited or positioned on top of the bottom layer 208. The lens 124 may then be placed over one or more LED dies 104. It is noted that the bottom layer 208 and/or top layer 204 may be deposited on the improved LED 120. For example, one or more of the layers 204,208 may be in liquid form (such as liquid silicon) and may be deposited on or over the LED dies and controller and then allowed to set or cure to form a finished layer. As can be seen, one or more borders or guides 212 may be provided to contain the layers 204,208 as they set or cure.

In a planar flat lens 124 a dual-layer configuration is highly beneficial in that the bottom layer 208 distances the light-altering top layer 204 away from the LED dies 104. Light rays from an individual LED die 104 thus travel through substantially the same amount or distance of the light-altering layer to produce light that is more uniform in color. Positioning the light-altering layer directly adjacent (i.e., without a bottom spacing layer) to the LED dies 104 causes the light rays to travel through the light-altering layer at a more severe angle thus increasing the distance the light rays travel within the light-altering layer. This problem is referred to as color over angle.

The spacing provided by the first or bottom layer of the lens 124 reduces the differences in angles of light rays traveling through the light-altering layer. To illustrate, the light rays may all pass through the light-altering layer at angles closer to 90 degrees with the multilayered lens 124. In this manner, the light rays travel a more similar and uniform distance through the light-altering layer resulting in light having a more uniform color even when viewed from various angles.

FIG. 2C illustrate an exemplary light ray traveling away from a LED die 104 at an angled vector. In a design having a single light altering layer, the distance traveled through the light altering layer is represented by the equation, $$\frac{h_1}{\cos\theta},$$

where $h_1$ is the distance from the LED die to the top of the light altering layer, and $\theta$ is the angle of a light ray traveling through the light altering layer. In contrast, in a dual layer configuration, such as the one disclosed herein, the distance traveled is represented by the equation, $$\frac{h_2 - h_1}{\cos\theta},$$

where $h_1$ distance between the LED die 104 and the top of the bottom layer 208, $h_2$ is the distance between the LED die and the top of the light altering top layer 204, and $\theta$ is the angle of a light ray traveling through the light altering top layer. Since we create an additional layer the angle $\theta$ will be limited and more important layer 204 is much smaller then layer 208 since it does not have to include the dies.

Figure 3B:
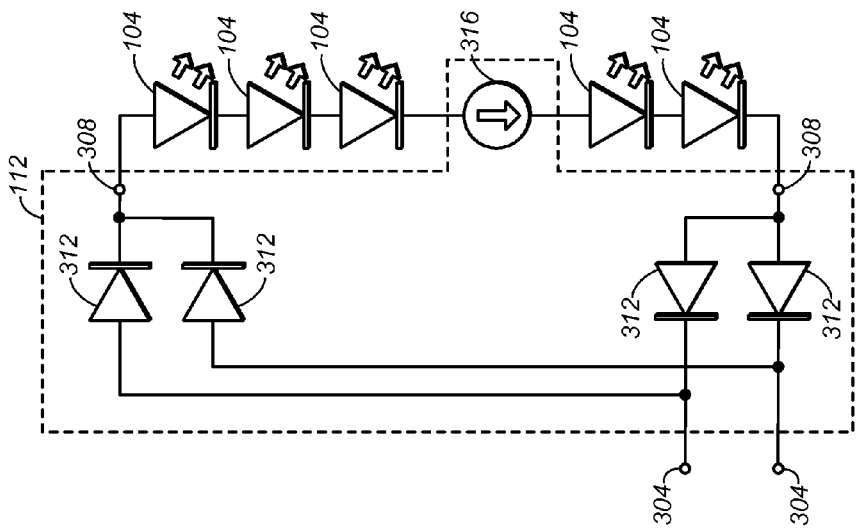
FIG. 3B is a block diagram illustrating an exemplary improved LED having current limiting capabilities.
Figure 3A:
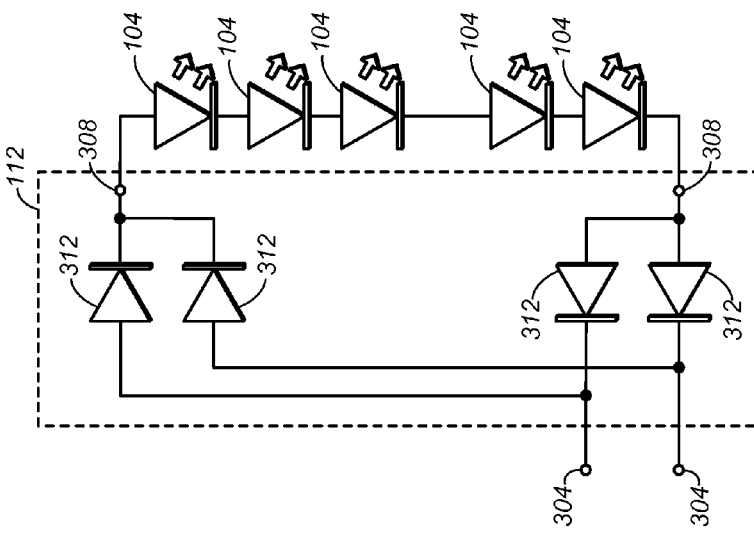
FIG. 3A is a block diagram illustrating an exemplary improved LED having AC/DC input capabilities.

FIGS. 3A-3K illustrate a variety of controller configurations. FIG. 3A illustrates an embodiment having a controller 112 configured to convert an AC input voltage into DC. A DC input voltage would remain DC. As can be seen, the controller 112 may accept the input voltage at one or more input terminals 304. The controller 112 may also be connected to one or more LED dies 104 through one or more output terminals 308. The LED dies 104 themselves may be connected by a circuit segment comprising at least one LED die and one or more electrical connections therefrom and (therebetween where there are multiple dies). It is noted that the LED dies 104 may be connected in parallel, in series, or both. As shown, the LED dies 104 are in series.

A controller 112 may comprise various components in its various configurations. For example, in FIG. 3A, the controller 112 comprises an arrangement of diodes 312 that rectifies an AC input voltage. As can be seen, the diodes 312 have been arranged such that the LED dies 104 receive a DC input voltage that the LED dies can use to emit light.

As can be seen, an improved LED 120 having such a controller 112 can be directly connected to an AC or DC source. To illustrate, referring to FIG. 4 it is possible to construct an LED light bulb 404, or other LED-based lighting by simply providing the improved LED 120 a power source.

Figure 4:
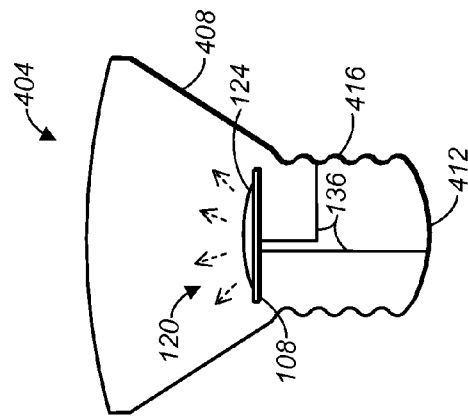
FIG. 4 is a side cross-sectional view of a light bulb having an exemplary improved LED.

As shown in the example of FIG. 4, the input terminals 304 of the improved LED 120 may be directly connected to the positive and negative contact surfaces 412,416 of a light bulb's housing 408. The wiring for this may be simple and straightforward, such as shown. In addition, due to the configuration of the controller 112, the improved LED 120 (and LED light bulb) may be used with both an AC input voltage and a DC input voltage without reconfiguration. A manufacturer would be able to manufacture AC and DC light bulbs with the same configuration with the improved LED 120.

In contrast, a traditional LED would require at least one, or more, supporting components. Traditional LEDs utilize external power supplies, drivers, or the like to provide the required DC voltage. Not only must these power supplies and drivers be carefully selected to provide the proper voltage/current to the LEDs, but they must also be squeezed into the (very commonly) small confines of a light bulb. A manufacturer must thus design a complex system that balances the number of LEDs and voltage/current requirements of the LEDs with an adequate power supply or driver. This must be accomplished while meeting other requirements such as size requirements (to fit various light sockets) and cost parameters.

The improved LED 120 addresses these issues. For instance, as stated the improved LED 120 may accept a wide variety of power, including AC or DC power. In addition, the improved LED 120 comprises a controller 112 which eliminates the need for external power supplies, drivers, or the like. Accordingly, the cost of the improved LED 120, even including costs for its controller 112, will be lower than a traditional LED. This is because traditional LEDs require costly power supplies, drivers, or the like, which the improved LED 120 does not.

The cost savings from eliminating power supplies, drivers, and the like may be diverted to other uses. For example, the costs saved may be used to increase the number of LED dies 104 in the improved LED 120. This allows the improved LED 120 to provide increased light output and/or handle increased voltages. Alternatively or in addition, the additional LED dies 104 may increase the life of the improved LED. For example, individual dies 104 may be rotated in and out of use, such as by one or more switches, such as those described below. The costs saved may also be used to provide controllers 112 having advanced features, such as those described herein.

Moreover, the improved LED 120 (as will be further detailed below) can accept a wide variety of input voltages and currents. This does away with the need for complex engineering as well as the need for different LED bulb configurations (utilizing distinct power supplies/drivers) that are required with traditional LEDs in order to allow the traditional LEDs to work properly in different lighting applications having different input voltages.

FIG. 3B illustrates a controller 112 having a current limiter 316 or current controller that can control the amount of current one or more LED dies 104 receive. As can be seen, the controller 112 may also include one or more diodes 312 to rectify an AC input voltage. The current limiter 316 may change its forward voltage to allow the LED dies 104 to receive their proper amount of current. For example, excess voltage from an AC source may be released as heat thus preventing the LED dies 104 from being damaged from excess voltage, while allowing the LED dies to emit light.

As can be seen, including the current limiter 316 increases the versatility of the improved LED 120. Namely, the improved LED 120 can now accept both AC or DC input voltage as well as a wide range of current, including current that would otherwise exceed what the LED dies 104 are ordinarily capable of handling.

Referring again to FIG. 4, it can be seen that an improved LED 120 having a current limiter may be easily incorporated into a light bulb, even as simply as connecting the input terminals 304 of the improved LED 120 to electrical contact surfaces 412,416 of the bulb's housing 404. In addition to providing an LED light bulb that is more versatile than traditional LED-based bulbs, this provides an LED light bulb that is also more versatile than a traditional incandescent bulb because this LED light bulb may be connected to AC or DC input voltage. The improved LED 120 accomplishes this while providing light with efficiency, in terms of power consumption, that far surpasses that of traditional incandescent bulbs.

FIG. 3C illustrates another exemplary controller 112. As can be seen, the controller 112 may include one or more microcontrollers 320, integrated circuits, or the like. In general, these components will be used to give the controller 112 some intelligence and/or the ability to measure and react to changing voltage/current conditions or other inputs by changing the operation of the improved LED 120. In some embodiments, such as that shown in FIG. 3C, the microcontroller 320 may operate one or more solid state switches 324 to change the operation of the improved LED 120. The microcontroller 320 may be connected to the one or more switches 324 by one or more leads, circuit traces, or other conductors. In one or more embodiments, one or more (or all) the switches 324 may be integrated into the microcontroller 320 (e.g., an ASIC). This is highly advantageous in that it reduces size and power requirements for the switches 324 and microcontroller 320.

In the embodiment of FIG. 3C, the microcontroller 320 may bypass one or more of the LED dies 104. This allows the improved LED 120 to adapt to changes in the input voltage. In the example of FIG. 3C for instance, the LED dies 104 have been connected in series. The forward voltage of the LED dies 104 will thus be the sum of each LED die's voltage. The microcontroller 320 may close a switch 324 to bypass one or more LED dies 104 and open a switch to activate one or more LED dies. It is noted that though as shown, each switch bypasses/activates a circuit segment having one LED die 104, an individual switch may bypass or activate a circuit segment having multiple LED dies.

By bypassing or activating LED dies 104, the forward voltage of the LED dies 104 may be controlled by the microcontroller 320. For example, in response to a spike in voltage, the microcontroller 320 may open one or more switches to increase the forward voltage. It is contemplated that the microcontroller 320 may open a number of switches sufficient to match the forward voltage to the input voltage. To illustrate, assuming 3-volt LED dies 104, the microcontroller 320 may open two of the switches 324 to increase the forward voltage across the plurality of LED dies 104 by 6 volts. The microcontroller 320 may alternatively close two switches to bypass two LED dies 104, thus decreasing the forward voltage by 6 volts.

In one or more embodiments, the microcontroller 320 may be programmed or configured with values that each switch 324 can contribute or take away from the forward voltage. Typically, this is accomplished by associating the voltage requirements for each LED die 104 to the switch 324 that bypasses/activates it. Also, the microcontroller 320 may have one or more predefined voltage thresholds. The microcontroller 320 may then open or close one or more switches 324 (as disclosed above) in response to the input power's voltage becoming greater than a predefined voltage threshold. This can also be determined by the voltage drop on the current limiter 316. For instance, when the voltage increases beyond a predetermined level at the current limiter 316 the microcontroller 320 may open a switch 324, and once the voltage drops under a predetermined level the microcontroller may close switch 324

It is noted that different numbers of LED dies 104 may be bypassed/activated and additional or fewer switches 324 may be provided in the various embodiments of the improved LED 120. In one or more embodiments, the number of switches 324 and or "switched" LED dies 104 may be determined by the typical or expected voltage fluctuation for a power source. For example, wall power from an outlet may commonly fluctuate 10 volts in a positive or negative direction in particular regions. Thus, in one embodiment, an improved LED 120 having 3-volt LED dies 104 may include three or four switched LED dies, which would allow the improved LED 120 to compensate for voltage changes between 3 and 12 volts.

In operation, the microcontroller 320 may measure input voltage with one or more measuring devices. The measuring device may share an electrical connection with the one or more LED dies 104 to allow such measurement. It is noted that the measuring device may also be configured to measure current, as will be discussed further below. The microcontroller 320 may then open or close one or more switches 324, as described above, depending on whether or not the input voltage is above or below a particular voltage threshold. For example, in an improved LED 104 capable of accepting 110 v power, the threshold may be 110 v and the microcontroller 320 may thus compensate for fluctuations above or below 110 v by matching the forward voltage of the LED dies to the measured voltage level.

This is highly beneficial in that it helps ensure that each of the LED dies 104 is receiving its designed for or ideal voltage. In this manner, the collection of LED dies 104 that may make up the improved LED 120, emit light as they have been engineered to do. The bypassing/activation of individual LED dies 104 will typically not be noticeable to an observer. However, a low voltage or voltage spike across all the LED dies 104 would likely noticeably reduce light output, damage the LED dies 104, or both.

Referring back to FIG. 4 again, it can be seen that even with the addition of the microcontroller 320 and the benefits the microcontroller brings, the improved LED 120 may still be just as easily incorporated into a light bulb. Namely, in one or more embodiments, the improved LED 120 need only be connected to a power source via its one or more voltage inputs 304, such as shown in FIG. 4.

Various other microcontroller 320 enabled embodiments are disclosed below. It is noted that though illustrated in the figures as connected to or coupled with the microcontroller, components of the improved LED 120 may be internal to the microcontroller. For example, rather than separate components, a microcontroller 320 could itself comprise one or more temperature sensors, switches, current limiters/controllers, bleeding transistors, current sensors, rectifiers or other components.

FIG. 3D illustrates another exemplary embodiment of the improved LED 120 having a microcontroller 320. In this embodiment, the microcontroller 320 may adjust current rather than voltage. It is contemplated that a microcontroller 320 could control both these factors in some embodiments. For example, the microcontroller 320 could operate one or more switches in addition to a current limiter 316.

As can be seen, the microcontroller 320 may be in communication with or connected to a current limiter 316. The microcontroller 320 may measure or sense the incoming current, such as by sharing an electrical connection with the one or more LED dies 104 (as discussed above) or by utilizing one or more measuring devices, sensors, or probes. In response, the microcontroller 320 may then control the current across the one or more LED dies 104 by adjusting a current limiter 316. In one embodiment, the microcontroller 320 in such embodiments may be configured to control the current to generate a power factor as close to one as possible. This may occur by the microcontroller 320 sensing the incoming voltage and adjusting the current across the LED dies 104 to match the current to the incoming voltage's phase and amplitude (which will provide a better power factor as well).

The microcontroller 320 may also have one or more predefined current thresholds in one or more embodiments. The microcontroller 320 may then adjust the current limiter 316 based on whether or not the incoming current is beyond a predefined current threshold. For example, if above a current threshold, the microcontroller 320 may adjust the current limiter 316 to keep the current at or near the threshold.

Figure 3E:
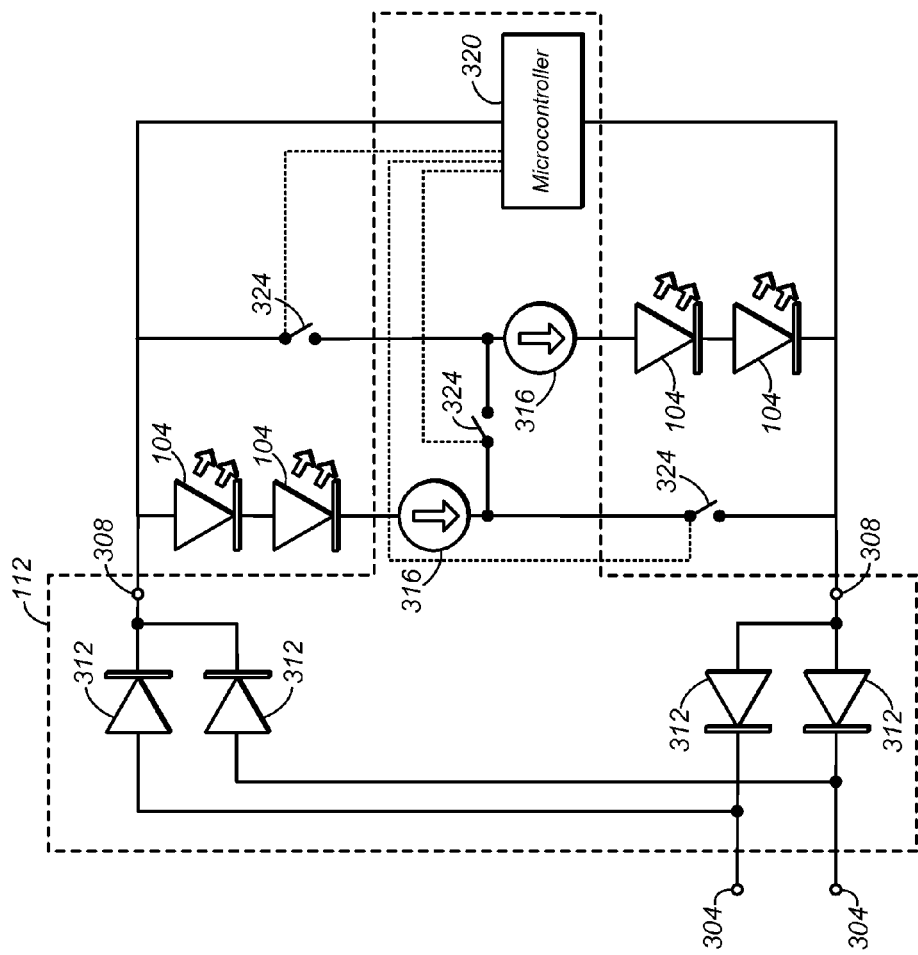
FIG. 3E is a block diagram illustrating an exemplary improved LED having a modifiable forward voltage.

FIG. 3E illustrates an exemplary embodiment of the improved LED 120 that allows an increased range of input voltages. As can be seen, the improved LED 120 comprises a controller 112 having at least one microcontroller 320 and one or more switches 324. In addition, one or more LED dies 104 may be on individual circuit segments that may be connected or disconnected by the switches 324. For example, in FIG. 3E two circuit segments having two LED dies 104 are used.

With such an arrangement, the microcontroller 320 can control whether or not sets of one or more LED dies 104 are connected in parallel or in series. As can be seen, closing the central switch 324 while leaving the outer two switches 324 open causes the first and second pair of LED dies 104 to be connected in series. Closing the outer two switches 324 while opening the central switch 324 causes the first and second pair of LED dies 104 to be connected in parallel.

In operation, it is contemplated that the microcontroller 320 may sense or measure the input voltage and, at a predetermined threshold, operate the switches 324 to convert the LED dies 104 from a parallel connection to a series connection. Once the LED dies 104 are connected in series, they may accept the increased voltage without being damaged or destroyed. This is because, when in series, the forward voltage of the LED dies 104 is the combined forward voltages of the individual LED dies. If the input voltage is below the threshold, the microcontroller 320 may change the LED dies 104 to a parallel connection to allow the LED dies to be powered by a lower voltage. This is because, in a parallel connection, the forward voltage of the LED dies 104 may be reduced by the number of individual LED dies that are connected in parallel. It is contemplated that more than two individual sets of LED dies 104 may be used to allow an even wider range of input voltages to be used. For example, in FIG. 3E a third (or even more) pair (or other number) of LED dies 104 coupled be connected or disconnected in parallel or series by one or more additional switches.

In addition, the microcontroller 320 and switches 324 may be configured to have supersets of LED dies 104, each having individual sets of LED dies that may be switched between series and parallel connections. The supersets themselves may then be switched between series and parallel connections. In addition, the supersets could include other supersets of LED dies 104. This allows a wide range of voltages to be accepted by an improved LED 120. It is contemplated that sets or supersets of LED dies 104 could be bypassed or activated by one or more switches as well to expand the range of input voltage the improved LED 120 may properly utilize.

As can be seen, the improved LED 120 can, in this manner, accommodate a wide variety of input voltages. This is highly beneficial, especially when considering the different varieties of lighting applications that LED lighting can benefit. For example, with the improved LED 120, one bulb could be used for low voltage and standard voltage lighting. As another example, with the improved LED 120, one bulb could be used in various regions (e.g., 110V regions such as the United States and 220V regions such as Europe). Such a bulb could be standardized thus reducing manufacturing costs. To illustrate, the improved LED may have 33 3-volt LED dies 104 on a first circuit segment and 33 3-volt LED dies on a second circuit segment. When provided approximately 100V the first and second circuit segment may be connected in parallel to keep the forward voltage of the LED dies around 100V (i.e., 99V). When provided approximately 200V, the first and second circuit segments may be switched to a series connection to generate a forward voltage around 200V (i.e., 198V).

Figure 3F:
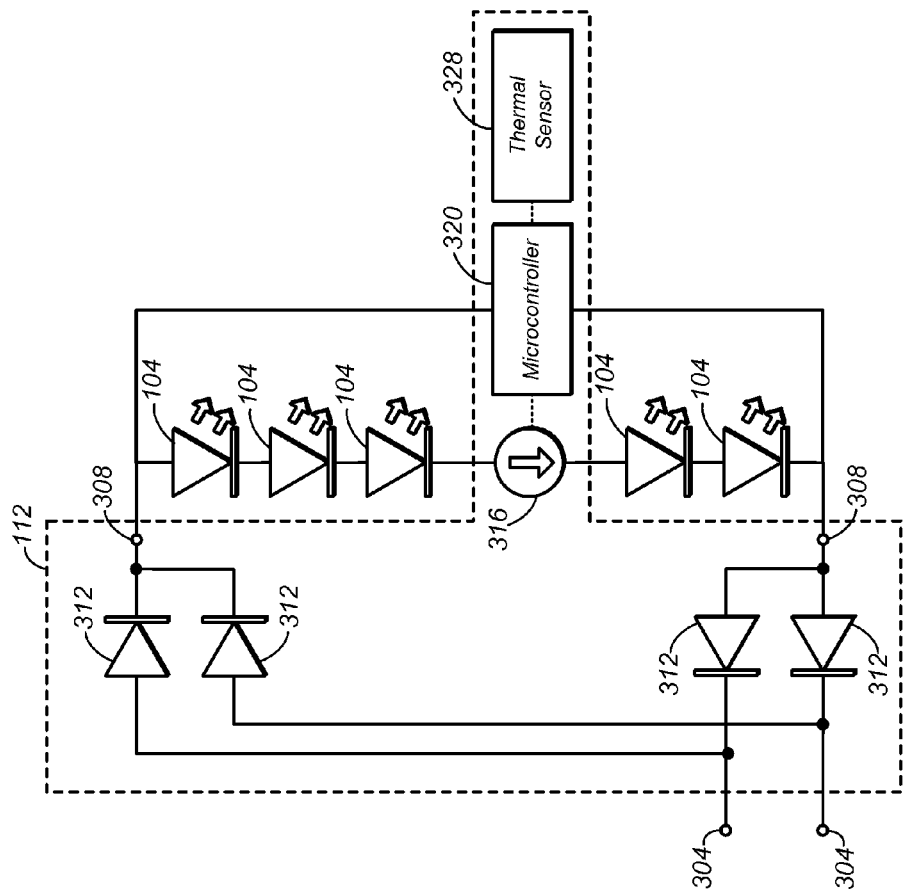
FIG. 3F is a block diagram illustrating an exemplary improved LED having thermal measurement and response capabilities.

FIG. 3F illustrates an exemplary improved LED 120 having a controller 112 that includes a thermal sensor 328. The thermal sensor 328 may measure the temperature of the improved LED 120. One or more thermal sensors 328 may be used to sense temperatures at different locations of the improved LED 120 if desired. As can be seen, the thermal sensor 328 may be in communication with a microcontroller 320. This allows the microcontroller 320 to respond to temperature changes at the improved LED 120. For example, the microcontroller 320 may adjust the current across one or more LED dies 104 if the temperature sensor 328 measures a temperature over or below a particular threshold. To illustrate, a temperature over a particular threshold may cause the microcontroller 320 to reduce the current to prevent the LED dies 104 or other portions of the improved LED 120 from overheating and damage.

In some embodiments, the thermal sensors 328 may also or alternatively be used to ensure the efficacy (such as in lumens per watt) is dependent of the current and temperature of the improved LED 120. For example, if light output is lower at particular temperatures, the microcontroller 320 may be configured to decrease current, such as by adjusting a current limiter 316, to compensate for the temperature. The microcontroller 320 may be configured or preset with one or more temperatures or temperature ranges where such an increase may be required to maintain consistent light output. To illustrate, a microcontroller 320 may include a lookup table having one or more temperatures or temperature ranges and associated current levels required to maintain consistent light output or efficacy.

FIG. 3G shows another exemplary improved LED 120 having a controller configured to have improved dimming capabilities. As can be seen, such embodiments, may include at least one bleeding transistor 336 and at least one current sensor 332. A microcontroller 320 may be coupled with the bleeding transistor 336 and current sensor 332. The microcontroller 320 may operate one or more switches based on input from the current sensor 332 to control the forward voltage of the LED dies. This will ensure a minimum current draw from the power supply to allow the use of triac based dimmers with the improved LED 120.

FIG. 3H illustrates an exemplary embodiment having an overvoltage cutoff feature. In such embodiments, a microcontroller 320 may be used to sense the input voltage to one or more LED dies 104. If the input voltage is above a particular threshold, the microcontroller 320 may operate one or more switches 324 to disconnect the LED dies 104. This protects the LED dies 104 from over voltage and damage that may occur because of the over voltage. When the input voltage returns to a "safe" level or is below the threshold, the microcontroller 320 may close the switch to allow the LED dies 104 to receive the input voltage once again. One benefit of this configuration is that the LED dies 104 may be protected from momentary surges which may damage them over time. In addition, the microcontroller 320 can automatically open or close the switches. Thus, there is no need for a user to "reset" the bulb if an over voltage occurs since the improved LED 120 will automatically continue operation once the input voltage is at an acceptable level.

Figure 3I:
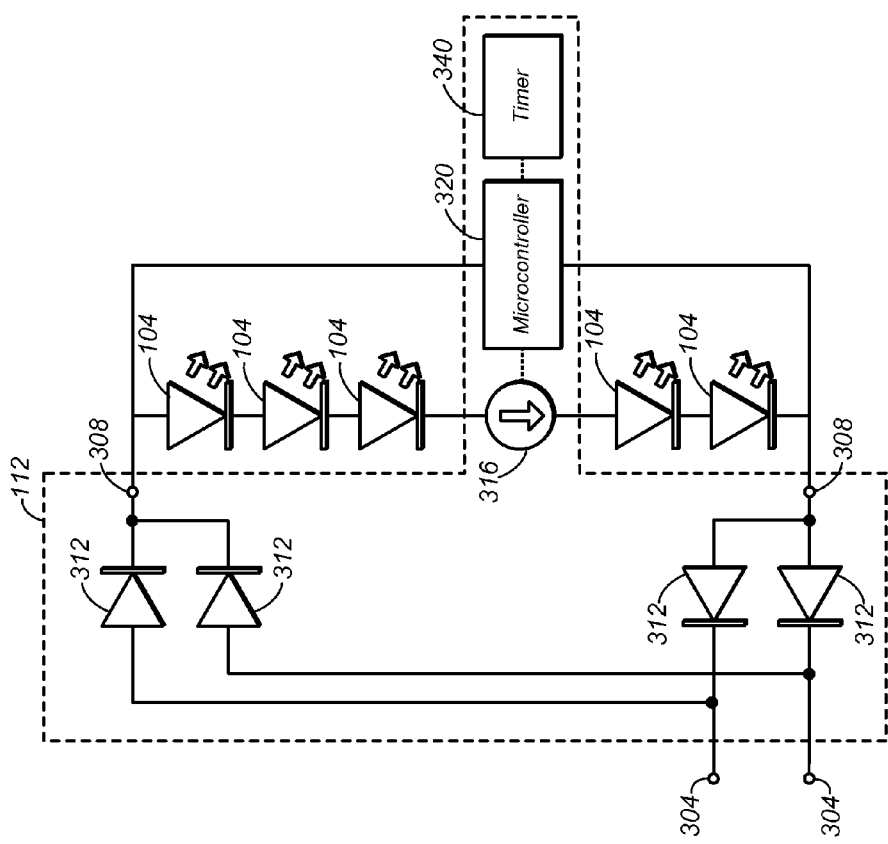
FIG. 3I is a block diagram illustrating an exemplary improved LED having time-based light output compensation capabilities.

FIG. 3I shows an embodiment comprising a controller 112 including a timer 340. In one or more embodiments, the timer 340 may be configured to track or record the time that the improved LED 120 or one or more LED dies 104 thereof is on. The timer 340 (or associated microcontroller 320) may have one or more preconfigured time thresholds stored or set therein. Each threshold may have am amount of current associated therewith. In this way, as the improved LED 120 reaches individual thresholds the microcontroller 320 may adjust the current across the LED dies 104. This is highly beneficial in that it allows the improved LED 120 to automatically compensate for the age or deterioration of its LED dies 104. For example, as the LED dies 104 age or are used, their light output may be diminished for a given input current. The microcontroller 320 may then increase the current to ensure consistent light output as the improved LED 120 reaches one or more time thresholds or ages.

This is highly beneficial in commercial and at least some residential applications where a particular amount of light or quality of light must be carefully maintained. In fact, sales at commercial locations may be reduced because of inadequate lighting. Also, users often pay for a particular lighting designs which would are not met as light output diminishes. Slight decreases in light output are virtually impossible to detect, especially since they occur over relatively large spans of time. The resulting light output may be significantly less than originally selected (such as for a retail space) but be undetected due to its gradual decrease over time. With the improved LED 120, the controller 112 may automatically compensate for the ageing of the LED dies 104 to provide consistent light output and quality. To illustrate, in one embodiment, current may start at or near 70% of that received by the improved LED 120 and increase over time to maintain a consistent light output as the LED dies 104 age.

The timer 340 and/or microcontroller 320 may also include a shut-off time threshold at which the improved LED 120 may be disabled or indicate that replacement is required. For example, the microcontroller 320 may open a switch to disconnect the LED dies 104, or reduce the current via a current controller 316 such that little or no light is emitted. Alternatively, the microcontroller 320 could operate a switch to blink the LED dies 104 at least momentarily, such as when first turned on. Users would then be aware that the improved LED 120 should be replaced. Again, due to gradual decreases in light output because of aged LED dies 104, the lower level of light output may not be perceived by observers. The shut-off time threshold allows the improved LED 120 to notify users that an LED bulb is no longer capable of the desired light output and should be replaced. Typically, the shut-off time threshold will be set to a time or LED die age where the improved LED's controller 112 is no longer able to compensate for diminished light output by increasing current.

Figure 3J:
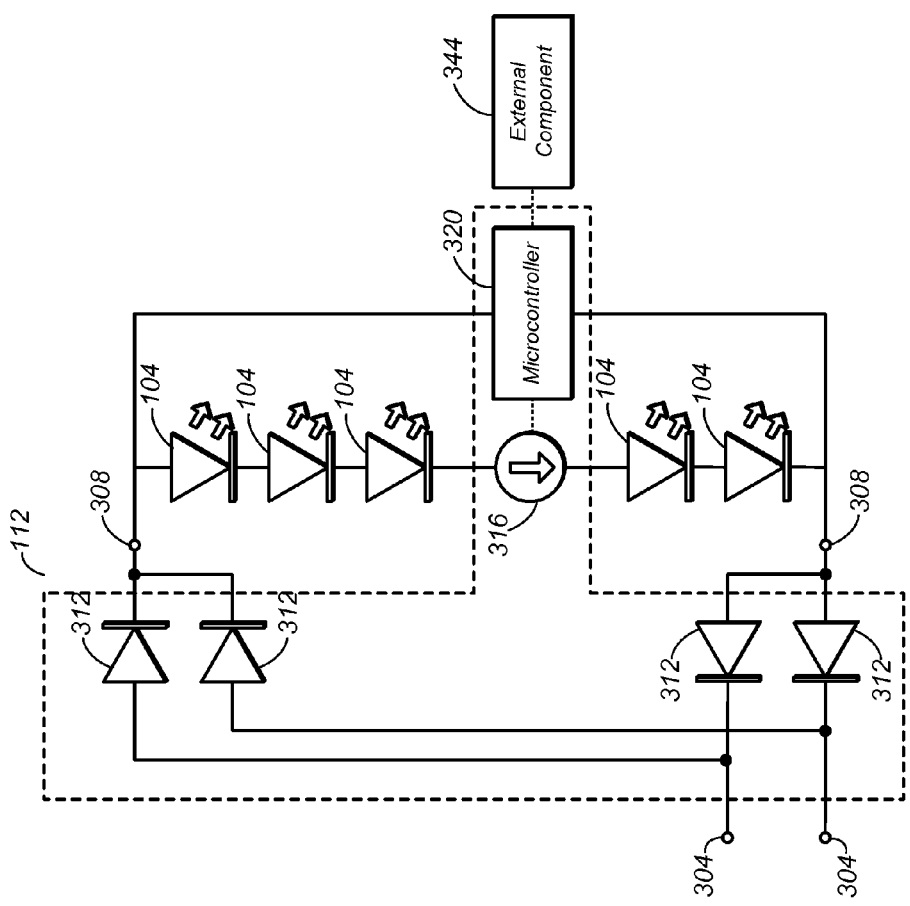
FIG. 3J is a block diagram illustrating an exemplary improved LED having an external component interface.

FIG. 3J illustrates an embodiment having a controller 112 which is capable of communication with an external component 344. The external component 344 may be used to change the drive from zero to a predefined maximum allowed level. This allows design flexibility when less light or less power is needed by design due to thermal design, energy regulation, etc. . . .

Figure 3K:
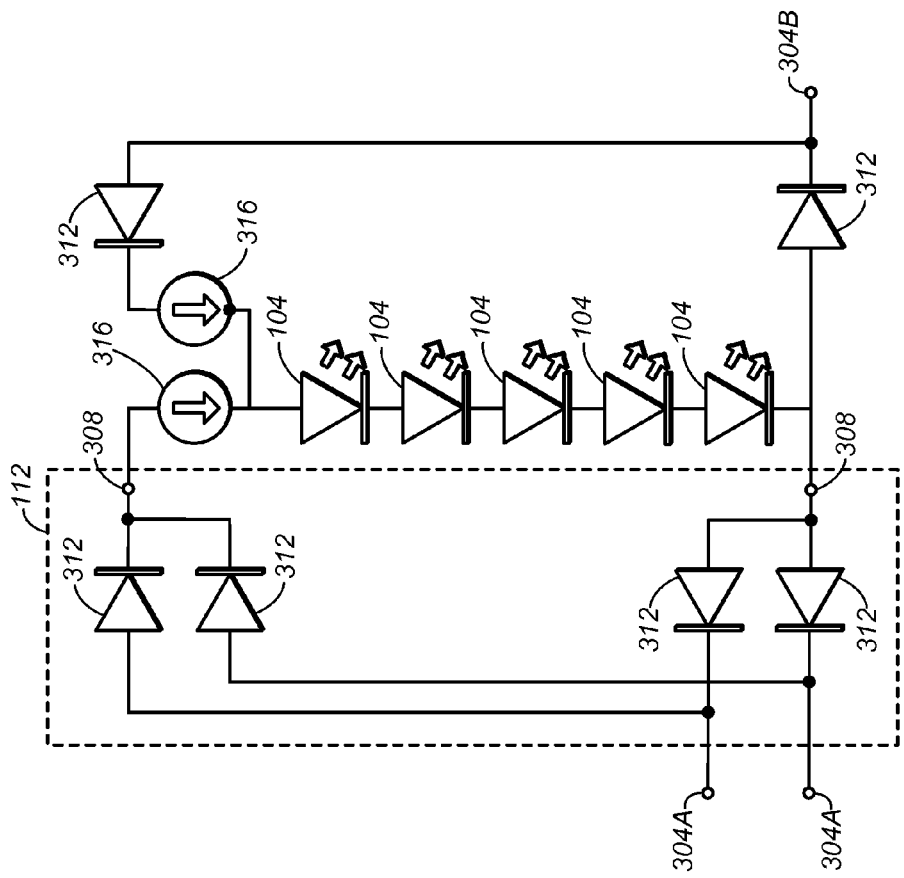
FIG. 3K is a block diagram illustrating an exemplary improved LED having a secondary electrical input terminal.

FIG. 3K illustrates another exemplary embodiment of the improved LED 120 configured to accept more than one input voltage. As can be seen, the improved LED 120 comprises a first set of input terminals 304A and an additional input terminal 304B. The additional input terminal 304B may receive additional current. In this manner, the LED dies 104 may be driven at different currents and thus provide at least two distinct light output levels. For example, a lower light output may be provided by receiving input voltage only at the first input terminals 304A while a higher light output may be provided when additional voltage/current is received at the additional input terminal 304B. It is contemplated that a 3-way light bulb, nightlight, lamp, (or other light) that provides at least two light levels may be constructed with an improved LED 120 in this manner. One or more current limiters 316 may be used to prevent too much current from being sent to the LED dies 104.

As discussed above with regard to the embodiments of FIGS. 3A-3C and FIG. 4, the improved LED 112 may be easily incorporated into various light bulb or other lighting device designs. The same applies for the embodiments disclosed in FIG. 3D-3K. Namely, embodiments of the improved LED 120 having microcontrollers, thermal sensors, current sensors, voltage sensors, and other components may be used to build light bulbs or other lighting devices, in some cases by simply connecting one or more input terminals 304 of the improved LED 120 to appropriate conductors or conductive surfaces 412,416 of a light bulb housing or the like. Again, this does away with the need for complex engineering when it comes to the use of LED lighting. In addition, the improved LED 120 also does away with the need for additional power supplies or drivers which increase cost. The improved LED 120 is capable of accomplishing these feats while accepting a wider range of input voltages/current than traditional bulbs (incandescent or LED-based) and while providing the additional lighting consistency, longevity, and other benefits disclosed herein.

In one or more embodiments, the various thresholds of the microcontroller may be set by a manufacturer, user, installer, or the like. For example, one or more voltage, current, time, temperature, and other thresholds may be set within the microcontroller or within a storage device in communication with the microcontroller. The thresholds may be hard-wired into the microcontroller or may be stored on a memory device or storage device, such as a ROM or RAM device. It is contemplated that the thresholds may be changed as desired if stored on a memory or storage device or other read/write storage medium.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. An improved LED comprising:
  a substrate having a planar shape;
  one or more LED dies mounted to the substrate;
  a controller electrically coupled to the one or more LED dies and mounted to the substrate, the controller configured to:
    receive electrical input of varying voltage at one or more terminals;

measure a current created by the electrical input; and
lower the current at at least one of the one or more LED dies based on a comparison between the measured current and a predefined current value;
a lens mounted to the substrate and configured to cover the one or more LED dies and the controller, the lens comprising:
a bottom clear silicon layer deposited over and encapsulating the one or more LED dies and the controller; and
a top layer impregnated with phosphorous deposited over the bottom layer;
wherein the one or more LED dies and the controller are located between the lens and the substrate.

2. The improved LED of claim 1, wherein the one or more LED dies are mounted around the controller to produce a light output that conceals the presence of the controller when the improved LED is on.

3. The improved LED of claim 2, wherein the one or more LED dies are mounted symmetrically around the controller.

4. The improved LED of claim 1, wherein the lens is translucent to diffuse light from the one or more LED dies to conceal the presence of the controller.

5. The improved LED of claim 1 further comprising at least one switch coupled in parallel to at least one of the one or more LED dies, wherein the controller is further configured to:
measure a voltage of the electrical input;
compare the voltage to a predefined voltage value;
open the at least one switch to activate the at least one of the one or more LED dies coupled in parallel to the at least one switch when the voltage is greater than the predefined voltage value; and
close the at least one switch to bypass the at least one of the one or more LED dies coupled in parallel to the at least one switch when the voltage is less than the predefined voltage value.

6. The improved LED of claim 1 further comprising at least one switch coupled in series to at least one of the one or more LED dies, wherein the controller is further configured to:
measure a voltage of the electrical input;
compare the voltage to a predefined voltage value;
close the at least one switch to activate the at least one of the one or more LED dies coupled in series to the at least one switch when the voltage is greater than the predefined voltage value; and
open the at least one switch to bypass the at least one of the one or more LED dies coupled in parallel to the at least one switch when the voltage is less than the predefined voltage value.

7. The improved LED of claim 1 further comprising at least one switch configured to connect and disconnect the one or more LED dies to the electrical input, wherein the controller is further configured to:
measure a voltage of the electrical input;
compare the voltage to a predefined overvoltage value;
close the at least one switch to connect the one or more LED dies to the electrical input when the voltage is less than the predefined overvoltage value; and
open the at least one switch to disconnect the one or more LED dies from the electrical input when the voltage is greater than the predefined overvoltage value.

8. The improved LED of claim 1 further comprising a timer configured to record the passage of time when activated, wherein the controller is configured to increase the predefined current value as the recorded time increases past one or more predefined thresholds to increase current provided to the one or more LED dies as the one or more LED dies age.

9. The improved LED of claim 1 further comprising a thermal sensor configured to measure the temperature of the one or more LED dies or the substrate, wherein the controller is configured to lower a current of the electrical input at at least one of the one or more LED dies based on a comparison between the measured current and a predefined current value for the measured temperature.

10. An improved LED comprising:
a microcontroller configured to measure a characteristic of an electrical input and compare the characteristic to a predefined value;
one or more first LED dies and one or more second LED dies, each of the one or more first and second LED dies having a forward voltage;
a circuit segment comprising the one or more first LED dies, the circuit segment having a total forward voltage comprising the sum of the forward voltage of the first one or more LED dies;
one or more switches coupled to the one or more second LED dies, the one or more switches configured to alter the total forward voltage of the circuit segment by connecting or disconnecting the one or more second LED dies to the circuit segment, the one or more switches controlled by the microcontroller; and
an enclosure comprising:
a substrate having the microcontroller, the one or more first and second LED dies, the circuit segment, and the one or more switches mounted thereto; and
a lens above the substrate and covering at least the one or more first and second LED dies, the lens comprising:
a bottom clear silicon layer deposited over and encapsulating the one or more LED dies and the controller; and
a top layer impregnated with phosphorous deposited over the bottom layer.

11. The improved LED of claim 10, wherein the measured characteristic is a current of the electrical input, and the microcontroller is configured to alter the amount of the current provided to the circuit segment based on the comparison between the measured current and the predefined current value.

12. The improved LED of claim 10, wherein the one or more switches are coupled to the one or more second LED dies in series.

13. The improved LED of claim 10, wherein the one or more switches are coupled to the one or more second LED dies in parallel.

14. The improved LED of claim 10, wherein the predefined value is a voltage level, and the one or more switches are configured to increase the total forward voltage of the circuit segment by connecting the one or more second LED dies to the circuit segment when the measured characteristic is above the predefined value.

15. The improved LED of claim 10, wherein predefined value is a voltage level, and the one or more switches are configured to increase the total forward voltage of the circuit segment by disconnecting the one or more second LED dies from the circuit segment when the measured voltage is below the predefined value.

16. A method for providing LED light output with an improved LED comprising:
mounting one or more first LED dies to a substrate;
mounting a microcontroller to the substrate;
providing one or more electrical input terminals at the substrate;

connecting a measuring device of the microcontroller to the one or more input terminals;

connecting the one or more first LED dies to the one or more electrical input terminals with one or more electrical conductors; and covering at least the one or more first LED dies and the microcontroller with a lens by:

depositing a bottom layer of clear silicon over the one or more first LED dies and the microcontroller; and depositing a top layer impregnated with phosphorous over the bottom layer, wherein the lens is formed by the bottom and top layer.

17. The method of claim 16 further comprising:

mounting one or more second LED dies to the substrate;

mounting one or more switches to the substrate; and connecting the one or more second LED dies to the one or more first LED dies through the one or more switches.

18. The method of claim 17 further comprising setting one or more predefined voltage thresholds for the microcontroller, wherein the microcontroller operates the one or more switches based on a result of a comparison between a voltage level measured by the measuring device and the one or more predefined voltage thresholds.

19. The method of claim 16 further comprising:

providing electrical power of a first voltage to the one or more electrical input terminals; and ceasing to provide the first voltage and thereafter providing electrical power of a second voltage to the one or more electrical input terminals, the second voltage being different than the first voltage.

20. The method of claim 18, wherein the first voltage is between 100V and 120V and the second voltage is between 230V and 250V.

* * * * *